United States Patent
Sakaguchi et al.

(10) Patent No.: US 9,293,539 B2
(45) Date of Patent: Mar. 22, 2016

(54) NITRIDE SEMICONDUCTOR EPITAXIAL WAFER AND NITRIDE SEMICONDUCTOR DEVICE

(71) Applicant: HITACHI METALS, LTD., Tokyo (JP)

(72) Inventors: Harunori Sakaguchi, Hitachi (JP); Takeshi Tanaka, Naka-gun (JP); Yoshinobu Narita, Mito (JP); Takeshi Meguro, Kitaibaraki (JP)

(73) Assignee: SCIOCS COMPANY LIMITED, Hitachi-shi (JP)

(*) Notice: Subject to any disclaimer, the term of this patent is extended or adjusted under 35 U.S.C. 154(b) by 0 days.

(21) Appl. No.: 14/582,728

(22) Filed: Dec. 24, 2014

(65) Prior Publication Data

US 2015/0194493 A1     Jul. 9, 2015

(30) Foreign Application Priority Data

Jan. 9, 2014  (JP) ................... 2014-002529

(51) Int. Cl.
*H01L 29/778* (2006.01)
*H01L 29/20* (2006.01)
*H01L 29/66* (2006.01)

(52) U.S. Cl.
CPC ...... *H01L 29/2003* (2013.01); *H01L 29/66462* (2013.01); *H01L 29/7787* (2013.01); *H01L 29/778* (2013.01)

(58) Field of Classification Search
CPC .............. H01L 29/2003; H01L 29/778; H01L 29/66462; H01L 29/7787
USPC ........................................................ 257/194
See application file for complete search history.

(56) References Cited

U.S. PATENT DOCUMENTS

| | | | |
|---|---|---|---|
| 5,679,965 A * | 10/1997 | Schetzina | 257/103 |
| 6,583,468 B2 | 6/2003 | Hori et al. | |
| 6,765,244 B2 * | 7/2004 | Sumiya et al. | 257/200 |
| 6,869,702 B2 * | 3/2005 | Shibata et al. | 428/698 |
| 7,183,578 B2 * | 2/2007 | Akasaki et al. | 257/79 |
| 7,196,399 B2 * | 3/2007 | Usui et al. | 257/615 |
| 7,723,216 B2 * | 5/2010 | Chakraborty et al. | 438/483 |
| 8,134,181 B2 * | 3/2012 | Sato et al. | 257/192 |
| 2011/0201184 A1 * | 8/2011 | Motoki et al. | 438/492 |

FOREIGN PATENT DOCUMENTS

JP       3836697 B2    8/2006

* cited by examiner

*Primary Examiner* — Nathan Ha
(74) *Attorney, Agent, or Firm* — Foley & Lardner LLP

(57) ABSTRACT

A nitride semiconductor epitaxial wafer includes a substrate, and a nitride semiconductor layer formed on the substrate, the nitride semiconductor layer including a (002) plane in an upper surface thereof. An in-plane dispersion of a full width half maximum (FWHM) of an X-ray rocking curve in the (002) plane or a (100) plane of the nitride semiconductor layer is not more than 30%. The wafer is not less than 100 μm in thickness and not less than 50 mm in diameter.

5 Claims, 5 Drawing Sheets

FIG.1

10 NITRIDE SEMICONDUCTOR EPITAXIAL WAFER
12 NITRIDE SEMICONDUCTOR LAYER
11 SUBSTRATE

FIG.2A

14 CRYSTAL COLUMN

13 UNDERLAYER

NITRIDE SEMICONDUCTOR EPITAXIAL WAFER AND NITRIDE SEMICONDUCTOR DEVICE

The present application is based on Japanese patent application No. 2014-002529 filed on Jan. 9, 2014, the entire contents of which are incorporated herein by reference.

BACKGROUND OF THE INVENTION

1. Field of the Invention

This invention relates to a nitride semiconductor epitaxial wafer and a nitride semiconductor device.

2. Description of the Related Art

A nitride semiconductor including indium (In), gallium (Ga), aluminum (Al), nitrogen (N) and the like has a high saturation electron speed and a high breakdown voltage, thus it is put to practical use as a material for an electronic device or the like capable of realizing high efficiency and high output in a high frequency region. In addition, it is also expected as a key material ensuring for high performance of a power device achieving a high efficiency of an inverter that is key parts and components of an electric vehicle (EV), a hybrid electric vehicle (HEV) and the like.

A nitride semiconductor device such as a nitride semiconductor high frequency electronic device and a nitride semiconductor power device generally includes an epitaxial layer comprised of a nitride semiconductor including indium (In), gallium (Ga), aluminum (Al), nitrogen (N) and the like. In order to form a nitride semiconductor device having high performance, it is required that the nitride semiconductor epitaxial layer has a good crystallinity.

As an index of the crystallinity of the nitride semiconductor epitaxial layer of the nitride semiconductor device, a method is known, the method being configured such that a full width half maximum of X-ray rocking curve in a predetermined plane is used (see e.g., JP-B-3836697). JP-B-3836697 determines an upper limit value of the full width half maximum of X-ray diffraction spectrum as a condition of high crystallinity.

SUMMARY OF THE INVENTION

The nitride semiconductor device can be usually obtained by epitaxially growing a nitride semiconductor layer on a substrate with a diameter of not less than 2 inches (5.08 cm) so as to form a nitride semiconductor epitaxial wafer, forming plural electrodes on the surface thereof, and then dicing the wafer to be formed in the shape of plural chips.

In JP-B-3836697, dispersion in the substrate surface of the crystallinity of the nitride semiconductor epitaxial layer in the nitride semiconductor epitaxial wafer before dividing to the shape of plural chips is not considered at all, thus there is a problem that electric characteristics extremely vary between plural nitride semiconductor devices obtained from one nitride semiconductor epitaxial wafer.

It is an object of the invention to provide a nitride semiconductor epitaxial wafer that allows plural nitride semiconductor devices to be produced with a decreased dispersion in electric characteristics.

It is another object of the invention to provide a nitride semiconductor device that is improved in yield by decreasing a dispersion in electric characteristics of nitride semiconductor devices produced.

(1) According to one embodiment of the invention, a nitride semiconductor epitaxial wafer comprises:

a substrate; and a nitride semiconductor layer formed on the substrate, the nitride semiconductor layer comprising a (002) plane in an upper surface thereof, wherein an in-plane dispersion of a full width half maximum (FWHM) of an X-ray rocking curve in the (002) plane or a (100) plane of the nitride semiconductor layer is not more than 30%, and wherein the wafer is not less than 100 μm in thickness and not less than 50 mm in diameter.

In the above embodiment (1) of the invention, the following modifications and changes can be made.

(i) The dispersion is not more than 25%.

(2) According to another embodiment of the invention, a nitride semiconductor device comprising a high electron mobility transistor formed by using the nitride semiconductor epitaxial wafer according to the embodiment (1).

Advantageous Effects of the Invention

According to one embodiment of the invention, a nitride semiconductor epitaxial wafer can be provided that allows plural nitride semiconductor devices to be produced with a decreased dispersion in electric characteristics.

According to another embodiment of the invention, a nitride semiconductor device can be provided that is improved in yield by decreasing a dispersion in electric characteristics of nitride semiconductor devices produced.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

[First Embodiment]

(Configuration of Nitride Semiconductor Epitaxial Wafer)

Figure 1:
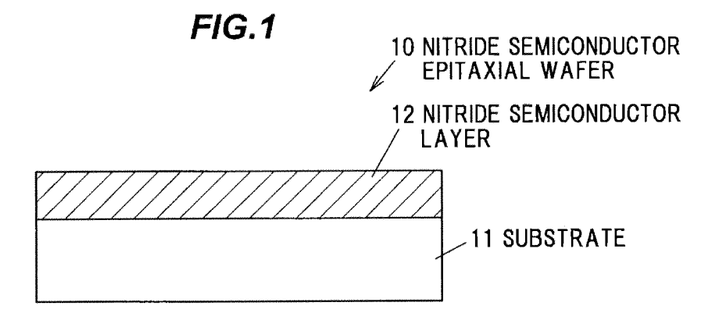
FIG. 1 is a vertical cross-sectional view schematically showing a nitride semiconductor epitaxial wafer according to a first embodiment of the invention.

FIG. 1 is a vertical cross-sectional view schematically showing the nitride semiconductor epitaxial wafer according to the first embodiment of the invention. The nitride semiconductor epitaxial wafer 10 includes the substrate 11 and the nitride semiconductor layer 12 formed on the substrate 11 by epitaxial growth.

The substrate 11 is, for example, a GaN substrate, a Si substrate or a SiC substrate.

The nitride semiconductor layer 12 is comprised of $Al_xGa_yIn_zN$ (x+y+Z=1, and 0≤x,y,z≤1) such as GaN, AlN, AlGaN, InGaN, namely a nitride semiconductor. In addition, the nitride semiconductor layer 12 can have a multilayer structure configured such that layers comprised of different nitride semiconductors are laminated. The plane orientation of the upper surface of the nitride semiconductor layer 12 is (002).

The nitride semiconductor epitaxial wafer 10 has a thickness of not less than 100 μm and a diameter of not less than 50 mm. The nitride semiconductor epitaxial wafer 10 can include a buffer layer between the substrate 11 and the nitride semiconductor layer 12.

In order to ensure the crystallinity of the nitride semiconductor layer 12, it is preferable that the full width half maximum of X-ray rocking curve of the nitride semiconductor layer 12 in a (002) plane thereof is not more than 300 second in the whole region in the plane. In addition, it is preferable that the full width half maximum of X-ray rocking curve of the nitride semiconductor layer 12 in a (100) plane thereof is not more than 600 second in the whole region in the plane.

Figure 5:
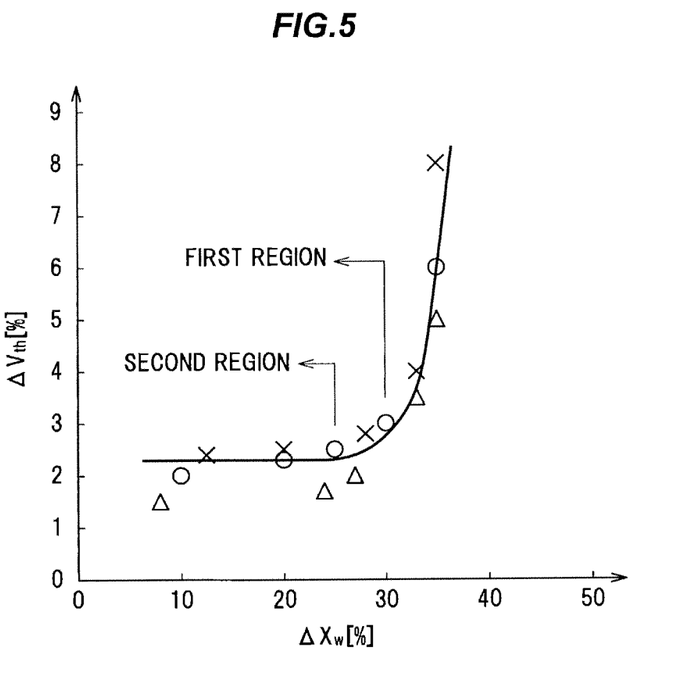
FIG. 5 is a graph showing a relationship between a dispersion ($\Delta X_{rc}$(%)) of a full width half maximum of X-ray and a dispersion ($\Delta V_{th}$(%)) of a threshold voltage of a high electron mobility transistor that are obtained from Tables 1 to 3 according to Examples 1 to 3.

A dispersion in the plane of the full width half maximum of X-ray rocking curve of the nitride semiconductor layer 12 in the (002) plane or the (100) plane is not more than 30%. The above-mentioned condition is satisfied, thereby as described below, a dispersion of a threshold voltage of a high electron mobility transistor (IMT) formed by using the nitride semiconductor epitaxial wafer 10 can be suppressed within 3%. If the dispersion in the plane of the full width half maximum is more than 30%, as shown in FIG. 5, the dispersion of the threshold voltage is drastically increased. Detail of FIG. 5 will be described later.

Figure 4:
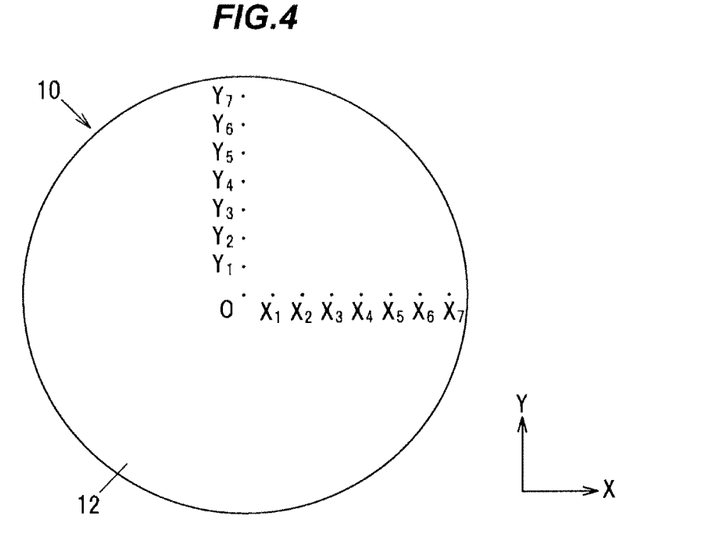
FIG. 4 is a plan view showing measurement points of the nitride semiconductor epitaxial wafers of Examples 1 to 3.

Here, the dispersion in the plane of the full width half maximum of X-ray rocking curve means a value obtained by measuring the full width half maximum of X-ray rocking curve in 15 measuring points as shown in FIG. 4 respectively, and calculating from plural obtained measurement values by using a formula: ((maximum value)−(minimum value))/(average value). Detail of FIG. 4 will be described later. Further, the measurement interval varies dependent on the diameter of the wafer. For example, in case that the diameter is 50 mm, the measurement interval is 3 mm, in case that the diameter is 3 inches, the measurement interval is 5 mm and in case that the diameter is 6 inches, the measurement interval is 10 mm.

The dispersion of the threshold voltage means a value obtained by measuring respectively the threshold voltage of the plural high electron mobility transistors (HEMT) obtained from one nitride semiconductor epitaxial wafer 10, and calculating from plural obtained measurement values by using a formula: ((maximum value)−(minimum value))/(average value).

In addition, in order to stably suppress within 2.5% the dispersion of a deep level amount of the high electron mobility transistors (HEMT) formed by using one nitride semiconductor epitaxial wafer 10, it is preferable that the dispersion of the full width half maximum of X-ray rocking curve of the nitride semiconductor layer 12 in the (002) plane or the (100) plane is not more than 25%. This is because, as shown in FIG. 5, if more than 25%, the dispersion of the threshold voltage starts to be increased.

Hereinafter, the measurement of the full width half maximum of X-ray rocking curve of the nitride semiconductor layer 12 in the (002) plane or the (100) plane thereof will be concretely explained. Further, the (002) plane is referred to as a C-plane in the nitride semiconductor.

(Measurement of Full Width Half Maximum of X-ray Rocking Curve)

The full width half maximum of X-ray rocking curve of the nitride semiconductor layer 12 becomes an index of the crystallinity of the nitride semiconductor layer 12 in the measurement point.

The full width half maximum of X-ray rocking curve shows uniformity of the plane orientation of crystal of a specific plane orientation in a region of a spot size (normally the diameter is approximately 1 mm) of the X-ray beam in the measurement point. Consequently, the full width half maximum of X-ray rocking curve in the growth plane of the crystal that carries out an epitaxial growth becomes an index of uniformity of the plane orientation of the growth plane.

Further, a vapor phase growth of the nitride semiconductor crystal that is a perovskite type crystal is not a step flow growth of a two dimensional growth as an arsenide semiconductor of a wurtzite type crystal, but is a three dimensional growth method, thus the nitride semiconductor crystal that carries out an epitaxial growth is comprised of an aggregate of a micro columnar crystal. Consequently, the uniformity of the plane orientation of the nitride semiconductor crystal is shown by uniformity of micro crystal column 14 in the growth direction.

For example, the full width half maximum of X-ray rocking curve of the nitride semiconductor crystal in the (002) plane becomes an index how exactly the growth directions of a large number of micro crystal columns that are grown in the (002) direction and constitute the nitride semiconductor layer 12 are aligned in the region of a spot size of the X-ray beam, and it is shown that the larger the full width half maximum is, the more inexactly the growth directions of the crystal columns are aligned.

Figure 2A:
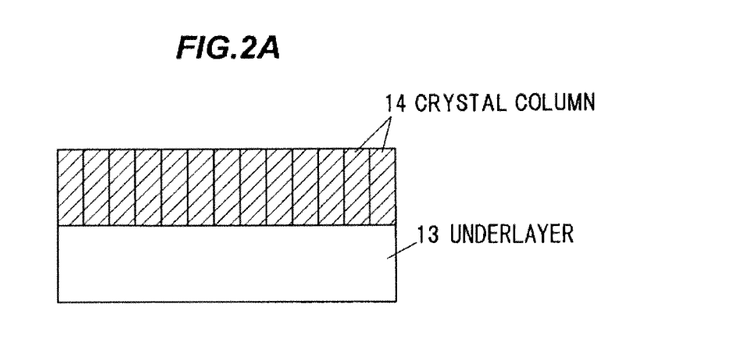
FIGS. 2A and 2B are a conceptual view schematically showing a state that micro crystal columns constituting a nitride semiconductor layer are grown on an underlayer.
Figure 2B:
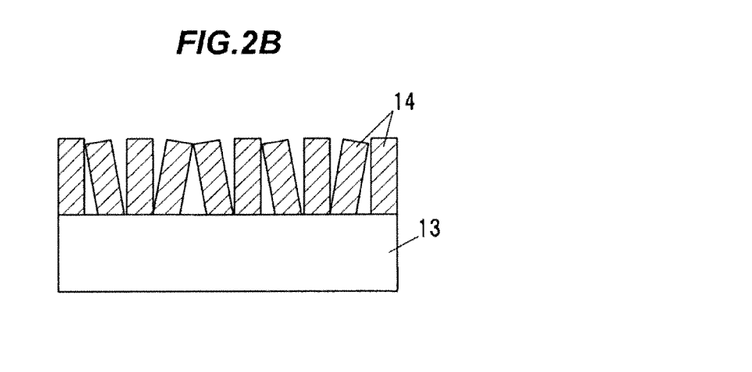

FIGS. 2A and 2B are conceptual views schematically showing a state that micro crystal columns 14 constituting the nitride semiconductor layer 12 are grown on the underlayer 13. FIG. 2A shows the crystal columns 14 configured such that the growth directions are uniform and FIG. 2B shows the crystal columns 14 configured such that the growth direction is not uniform. Further, the underlayer 13 is the other layer in the substrate 11 or the nitride semiconductor layer 12.

In a region in which the growth direction of the crystal columns 14 is uniform as shown in FIG. 2A, uniformity of the plane orientation is high, thus the full width half maximum of X-ray rocking curve becomes small in comparison with a region in which the growth direction of the crystal columns 14 is not uniform as shown in FIG. 2B.

In addition, in case that an n-type conductive layer is formed in the nitride semiconductor layer 12, an n-type impurity such as Si, O is introduced while the nitride semiconductor crystal constituting the nitride semiconductor layer 12 is epitaxially grown by a metal organic vapor phase epitaxy growth method (MOVPE growth method) or the like. At this time, in case that the growth plane of the nitride semiconductor crystal is the (002) plane, the n-type impurity such as Si, O is hard to be incorporated, but in case that the growth plane is the other plane, it is easily incorporated.

For this reason, the lower the uniformity of the growth direction of the micro crystal columns 14 is, the crystal columns 14 being epitaxially grown by using the (002) plane as the growth plane and constituting the nitride semiconductor layer 12, the more easily the n-type impurity is incorporated into the nitride semiconductor crystal, so that the n-type impurity concentration is heightened. Consequently, the full width half maximum of X-ray rocking curve of the nitride semiconductor layer 12 becomes an index of the n-type impurity concentration in the n-type conductive layer in the measurement point, the nitride semiconductor layer 12 being configured to be comprised of the nitride semiconductor crystal grown by using the (002) plane as the growth plane, and configured such that the plane orientation of the upper surface thereof is the (002) plane.

(Dispersion of Full Width Half Maximum of X-ray Rocking Curve)

As mentioned above, the full width half maximum of X-ray rocking curve of the nitride semiconductor layer 12 configured such that the plane orientation of the upper surface thereof is the (002) plane becomes an index of the crystallinity and the n-type impurity concentration in the measurement point. For this reason, the dispersion in the plane of the full width half maximum of the X-ray rocking curve of the nitride semiconductor layer 12 configured such that the plane orientation of the upper surface thereof is the (002) plane becomes an index of the dispersion in the plane of the crystallinity and the n-type impurity concentration.

In case that the full width half maximum of X-ray rocking curve of the nitride semiconductor layer 12 configured such that the plane orientation of the upper surface thereof is the (002) plane is measured, it is preferable that the full width half maximum of X-ray rocking curve of the (002) plane or the (100) plane is measured. By the full width half maximum of X-ray rocking curve of the (002) plane, an orientation of a plane parallel to the upper surface of the nitride semiconductor layer 12 can be evaluated and by the full width half maximum of X-ray rocking curve of the (100) plane perpendicular to the (002) plane, an orientation of a plane perpendicular to the upper surface of the nitride semiconductor layer 12 can be evaluated.

In case that plural semiconductor elements are formed in the nitride semiconductor epitaxial wafer 10 and are diced so as to be divided into an individual semiconductor element, if the dispersion in the plane of the crystallinity of the nitride semiconductor layer 12 is large, dispersions of various characteristics such as a leak characteristic of the individual semiconductor element become large.

In addition, in case that plural semiconductor elements having the n-type conductive layer are formed in the nitride semiconductor epitaxial wafer 10 and are diced so as to be divided into an individual semiconductor element, if the dispersion of the n-type impurity concentration in the plane of the of the nitride semiconductor layer 12 is large, dispersions of the threshold voltage and the like of the individual semiconductor element become large.

[Second Embodiment]

In the second embodiment, a high electron mobility transistor (HEMT) that is a nitride semiconductor device is formed by using the nitride semiconductor epitaxial wafer according to the first embodiment.

(Configuration of Nitride Semiconductor Device)

Figure 3:
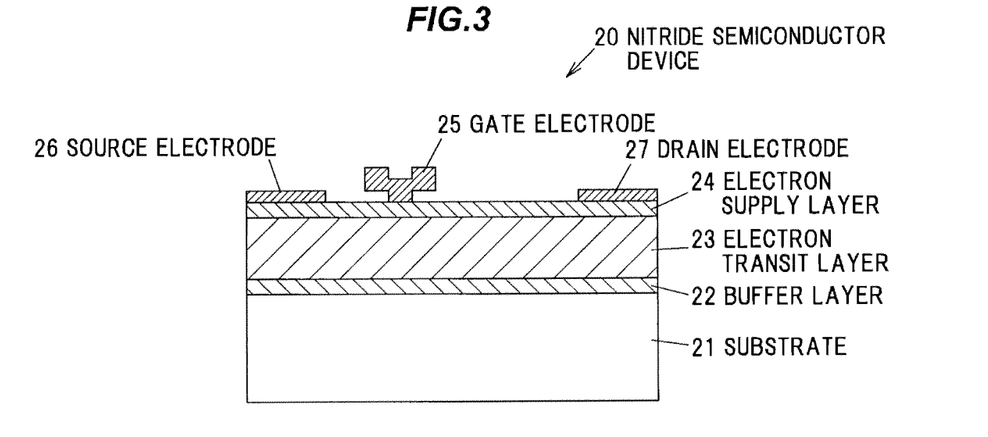
FIG. 3 is a vertical cross-sectional view schematically showing a nitride semiconductor device according to a second embodiment of the invention.

FIG. 3 is a vertical cross-sectional view schematically showing the nitride semiconductor device according to the second embodiment of the invention. The nitride semiconductor device 20 is a high electron mobility transistor and includes the substrate 21; the buffer layer 22, the electron transit layer 23 and the electron supply layer 24 that are laminated on the substrate 21; and the gate electrode 25, the source electrode 26 and the drain electrode 27 that are connected to the electron supply layer 24.

The nitride semiconductor device 20 is obtained by forming the plural nitride semiconductor devices on the nitride semiconductor epitaxial wafer 10 so as to be divided by dicing. The substrate 21 is corresponding to the substrate 11 of the nitride semiconductor epitaxial wafer 10 according to the first embodiment, and a laminated body of the buffer layer 22, the electron transit layer 23 and the electron supply layer 24 is corresponding to the nitride semiconductor layer 12 of the nitride semiconductor epitaxial wafer 10.

The buffer layer 22 is, for example, an AlN layer. The electron transit layer 23 is, for example, a GaN layer, and has a two-dimensional electron gas as a channel in the vicinity of the interface between the electron supply layer 24. The electron supply layer 24 is, for example, an AlGaN layer, and has a depletion layer configured such that the thickness varies dependent on voltage applied to the gate electrode 25. By varying the thickness of the depletion layer, a concentration of the two-dimensional electron gas in the electron supply layer 24 can be controlled.

The electron supply layer 24 is corresponding to the n-type conductive layer of the nitride semiconductor layer 12. Electrons contained in the electron supply layer 24, the electrons being supplied from the n-type impurity such as Si, O, moves to the electron transit layer 23 that has electron affinity larger than the electron supply layer 24 so as to form the two-dimensional electron gas.

(Manufacturing Method of Nitride Semiconductor Device)

Hereinafter, as an example of a manufacturing method of nitride semiconductor device 20, an example in case that the substrate 21 is a SiC substrate, the buffer layer 22 is an AlN layer, the electron transit layer 23 is a GaN layer and the electron supply layer 24 is an AlGaN layer will be explained.

First, an AlN crystal is grown on the substrate 11, so as to form an AlN crystal layer that becomes the buffer layer 22 in the nitride semiconductor device 20.

Next, an GaN crystal that becomes an initial growth layer of the electron transit layer 23 is grown on the AlN crystal layer by using the (002) plane as the growth plane, and then heat treatment is applied thereto for a predetermined time in an ammonia and hydrogen atmosphere or in an atmosphere adding nitrogen to the ammonia and hydrogen. It is preferable that the condition of the heat treatment is configured such that the heat treatment temperature is 600 to 1200 degrees C., the heat treatment time is approximately 10 sec to 10 minute and the partial pressure ratio of ammonia and hydrogen, namely ammonia partial pressure/hydrogen partial pressure, is 3/5 to 8/2.

During this heat treatment, a part of the GaN crystal, especially the crystal column 14 of which growth plane is inclined, is etched by hydrogen so that gallium is disconnected from the crystal. This gallium migrates on the growth plane of the GaN crystal so as to redeposit to the growth plane in a thermal equilibrium condition. Due to this, the growth plane of the crystal column 14 is naturally aligned to the (002) plane. The condition of the heat treatment is adjusted, thereby the crystallinity of the electron transit layer 23 can be controlled.

Further, the GaN crystal that becomes an initial growth layer of the electron transit layer 23 is grown at a low temperature, thereby a uniform nuclear growth can be realized so that the growth axis of each grown nucleus can be aligned. For example, a temperature of the above-mentioned low temperature growth is a temperature between a normal growth temperature and a temperature lower by 100 degrees C. than the normal growth temperature, for example, the lower limit of the temperature of the low temperature growth on the GaN substrate is approximately 900 degrees C., and the lower limit of the temperature of the low temperature growth on the SiC substrate is approximately 950 degrees C. As a result of this, the uniformity of the growth plane of the GaN crystal can be further heightened. In this case, the dispersion in the plane of the full width half maximum of X-ray rocking curve of the nitride semiconductor epitaxial wafer 10 is reduced.

After applying the heat treatment to the initial growth layer, the GaN crystal is further grown so as to form a GaN layer that becomes the electron transit layer 23 in the nitride semiconductor device 20.

After that, an AlGaN layer that becomes the electron supply layer 24 in the nitride semiconductor device 20 is formed on the GaN layer, in addition, the gate electrode 25, the source electrode 26 and the drain electrode 27 are formed in each region to be defined by that the nitride semiconductor epitaxial wafer 10 is divided to the plural nitride semiconductor devices 20, and then the nitride semiconductor epitaxial wafer 10 with the electrodes is divided so that the plural nitride semiconductor devices 20 can be obtained.

Further, even when the above-mentioned heat treatment to the initial growth layer of the electron transit layer 23 is applied to the growth process of the buffer layer 22, the same effect can be obtained. In this case, Al of the AlN layer of which growth plane is inclined is disconnected so as to redeposit to the aligned growth plane.

In addition, in case that the buffer layer 22 is an AlGaN layer, an InGaN layer or an InAlGaN layer, the nitride semiconductor device 20 can be also obtained by the same method. In addition, in case that the electron transit layer 23 is an AlGaN layer, an InGaN layer or an InAlGaN layer, the nitride semiconductor device 20 can be also obtained by the same method.

(Advantageous Effect of Embodiment)

According to the embodiments, a nitride semiconductor epitaxial wafer having a diameter of not less than 50 mm and configured such that a dispersion in a plane of a full width half maximum of X-ray rocking curve is reduced can be provided, and by using the nitride semiconductor epitaxial wafer, plural nitride semiconductor devices configured such that a dispersion of electric characteristic is small so that a yield of the nitride semiconductor device is enhanced can be provided.

EXAMPLE 1

Hereinafter, evaluation results of the nitride semiconductor device 20 will be described, the nitride semiconductor device 20 being a high electron mobility transistor and being formed by using the nitride semiconductor epitaxial wafer 10 configured such that the substrate 11 is a SiC substrate having a diameter of 3 inches.

Table 1 described below shows a full width half maximum of X-ray of the manufactured five nitride semiconductor epitaxial wafers 10 (A1 to A5) in each measurement point, a dispersion ($\Delta X_w$(%)) in a plane of the full width half maximum of X-ray, and a dispersion ($\Delta V_{th}$(%)) of a threshold voltage of the plural high electron mobility transistors obtained each nitride semiconductor epitaxial wafer 10. In the Example, the full width half maximum of X-ray was measured in plural measurement points described below of the nitride semiconductor epitaxial wafers 10 (A1 to A5) having a diameter of 3 inches, and the threshold voltage of the plural high electron mobility transistors obtained by dividing each nitride semiconductor epitaxial wafer 10 was measured.

Here, the nitride semiconductor device 20 (high electron mobility transistor) evaluated in the Example is configured such that the buffer layer 22 is an AlN layer, the electron transit layer 23 is a GaN layer and the electron supply layer 24 is an AlGaN layer. Namely, the nitride semiconductor layer 12 of the nitride semiconductor epitaxial wafer 10 is comprised of a laminated body of the AlN layer, the GaN layer and AlGaN layer.

TABLE 1

| Measured wafer | Full width half maximum of X-ray in each measurement point (sec) | | | | | | | | | | | | | | | $\Delta X_W$ (%) | $\Delta V_{th}$ (%) |
|---|---|---|---|---|---|---|---|---|---|---|---|---|---|---|---|---|---|
| | O | $X_1$ | $X_2$ | $X_3$ | $X_4$ | $X_5$ | $X_6$ | $X_7$ | $Y_1$ | $Y_2$ | $Y_3$ | $Y_4$ | $Y_5$ | $Y_6$ | $Y_7$ | | |
| A1 | 200 | 205 | 207 | 209 | 210 | 213 | 217 | 221 | 203 | 208 | 203 | 205 | 212 | 216 | 219 | 10 | 2.0 |
| A2 | 202 | 203 | 204 | 207 | 214 | 240 | 235 | 246 | 204 | 209 | 204 | 212 | 235 | 238 | 240 | 20 | 2.3 |
| A3 | 197 | 207 | 209 | 215 | 224 | 230 | 245 | 253 | 203 | 205 | 218 | 222 | 227 | 243 | 250 | 25 | 2.5 |
| A4 | 199 | 209 | 211 | 220 | 230 | 243 | 255 | 268 | 208 | 209 | 217 | 220 | 234 | 259 | 262 | 30 | 3.0 |
| A5 | 203 | 207 | 208 | 225 | 239 | 250 | 270 | 287 | 210 | 215 | 230 | 235 | 265 | 276 | 280 | 35 | 6.0 |

FIG. 4 shows the measurement points in Table 1. The measurement point O is the center of the nitride semiconductor epitaxial wafer 10, the measurement points $X_1$ to $X_7$ are points respectively located at 5 mm, 10 mm, 15 mm, 20 mm, 25 mm, 30 mm and 35 mm from the center along the X direction, and the measurement points $Y_1$ to $Y_7$ are points respectively located at 5 mm, 10 mm, 15 mm, 20 mm, 25 mm, 30 mm and 35 mm from the center along the Y direction. Here, the X direction and the Y direction are mutually arranged perpendicularly.

EXAMPLE 2

Hereinafter, evaluation results of the nitride semiconductor device 20 will be described, the nitride semiconductor device 20 being a high electron mobility transistor and being formed by using the nitride semiconductor epitaxial wafer 10 configured such that the substrate 11 is a GaN substrate having a diameter of 3 inches.

Table 2 described below shows a full width half maximum of X-ray of the manufactured five nitride semiconductor epitaxial wafers 10 (B1 to B5) in each measurement point, a dispersion ($\Delta X_w$(%)) in a plane of the full width half maximum of X-ray, and a dispersion ($\Delta V_{th}$(%)) of a threshold voltage of the plural high electron mobility transistors obtained each nitride semiconductor epitaxial wafer 10. In the Example, the full width half maximum of X-ray was measured in plural measurement points described below of the nitride semiconductor epitaxial wafers 10 (B1 to B5) having a diameter of 3 inches, and the threshold voltage of the plural high electron mobility transistors obtained by dividing each nitride semiconductor epitaxial wafer 10 was measured. The measurement points in the Example are O, $X_1$ to $X_7$ and $Y_1$ to $Y_7$ as well as Example 1.

Further, the configuration of the nitride semiconductor epitaxial wafer 10 and the nitride semiconductor device 20 evaluated in the Example is the same configuration as that of the nitride semiconductor epitaxial wafer 10 and the nitride semiconductor device 20 evaluated in Example 1.

TABLE 2

| Measured wafer | Full width half maximum of X-ray in each measurement point (sec) | | | | | | | | | | | | | | | $\Delta X_W$ (%) | $\Delta V_{th}$ (%) |
|---|---|---|---|---|---|---|---|---|---|---|---|---|---|---|---|---|---|
| | O | $X_1$ | $X_2$ | $X_3$ | $X_4$ | $X_5$ | $X_6$ | $X_7$ | $Y_1$ | $Y_2$ | $Y_3$ | $Y_4$ | $Y_5$ | $Y_6$ | $Y_7$ | | |
| B1 | 131 | 133 | 135 | 134 | 137 | 137 | 138 | 142 | 135 | 134 | 133 | 139 | 139 | 139 | 141 | 8 | 1.5 |
| B2 | 127 | 133 | 129 | 134 | 135 | 140 | 146 | 160 | 132 | 128 | 133 | 134 | 138 | 145 | 153 | 2 | 1.7 |
| B3 | 125 | 131 | 129 | 133 | 138 | 144 | 152 | 163 | 132 | 131 | 135 | 142 | 143 | 153 | 162 | 27 | 2.0 |
| B4 | 120 | 122 | 127 | 129 | 137 | 137 | 145 | 165 | 125 | 123 | 134 | 139 | 138 | 143 | 163 | 33 | 3.5 |
| B5 | 103 | 114 | 129 | 134 | 137 | 144 | 148 | 150 | 110 | 125 | 135 | 140 | 143 | 146 | 150 | 35 | 5.0 |

EXAMPLE 3

Hereinafter, evaluation results of the nitride semiconductor device 20 will be described, the nitride semiconductor device 20 being a high electron mobility transistor and being formed by using the nitride semiconductor epitaxial wafer 10 configured such that the substrate 11 is a SiC substrate having a diameter of 6 inches.

Table 3 described below shows a full width half maximum of X-ray of the manufactured five nitride semiconductor epitaxial wafers 10 (C1 to C5) in each measurement point, a dispersion ($\Delta X_w$(%)) in a plane of the full width half maximum of X-ray, and a dispersion ($\Delta V_{th}$(%)) of a threshold voltage of the plural high electron mobility transistors obtained each nitride semiconductor epitaxial wafer 10. In the Example, the full width half maximum of X-ray was measured in plural measurement points described below of the nitride semiconductor epitaxial wafers 10 (C1 to C5) having a diameter of 6 inches, and the threshold voltage of the plural high electron mobility transistors obtained by dividing each nitride semiconductor epitaxial wafer 10 was measured.

Further, the configuration of the nitride semiconductor epitaxial wafer 10 and the nitride semiconductor device 20 evaluated in the Example is the same configuration as that of the nitride semiconductor epitaxial wafer 10 and the nitride semiconductor device 20 evaluated in Example 1.

In Table 3, the measurement point O is the center of the nitride semiconductor epitaxial wafer 10, the measurement points $X_1$ to $X_7$ are points respectively located at 10 mm, 20 mm, 30 mm, 40 mm, 50 mm, 60 mm and 70 mm from the center along the X direction, and the measurement points $Y_1$ to $Y_7$ are points respectively located at 10 mm, 20 mm, 30 mm, 40 mm, 50 mm, 60 mm and 70 mm from the center along the Y direction. Here, the X direction and the Y direction are mutually arranged perpendicularly.

FIG. 5 is a graph showing a relationship between the dispersion ($\Delta X_w$(%)) of the full width half maximum of X-ray and the dispersion ($\Delta V_{th}$(%)) of the threshold voltage of the high electron mobility transistor that are obtained from Tables 1 to 3.

In FIG. 5, a mark "○" (a circle mark) shows values obtained from the nitride semiconductor epitaxial wafers 10 (A1 to A5) of Example 1, a mark "△" (a triangle mark) shows values obtained from the nitride semiconductor epitaxial wafers 10 (B1 to B5) of Example 2, and a mark "×" (an X mark) shows values obtained from the nitride semiconductor epitaxial wafers 10 (C1 to C5) of Example 3.

FIG. 5 shows that the dispersion ($\Delta X_w$(%)) in the plane of the full width half maximum of the X-ray rocking curve in the (002) plane of the nitride semiconductor layer 12 is controlled to be not more than 30% (shown as the first region in the drawing), thereby the dispersion ($\Delta V_{th}$(%)) of the threshold voltage of the high electron mobility transistor (HEMT) formed by using the nitride semiconductor epitaxial wafer 10 can be suppressed within 3%. If the dispersion ($\Delta X_w$(%)) in the plane of the full width half maximum is more than 30%, the dispersion ($\Delta V_{th}$(%)) of the threshold voltage is drastically increased.

In addition, FIG. 5 shows that it is preferable that the dispersion ($\Delta X_w$(%)) in the plane of the full width half maximum is controlled to be not more than 25%. The dispersion ($\Delta X_w$(%)) in the plane of the full width half maximum is controlled to be not more than 25% (shown as the second region in the drawing), thereby the dispersion ($\Delta V_{th}$(%)) of the threshold voltage can be suppressed within 2.5%.

Although the invention has been described with respect to the specific embodiments for complete and clear disclosure, the appended claims are not to be thus limited but are to be construed as embodying all modifications and alternative

TABLE 3

| Measured wafer | Full width half maximum of X-ray in each measurement point (sec) | | | | | | | | | | | | | | | $\Delta X_W$ (%) | $\Delta V_{th}$ (%) |
|---|---|---|---|---|---|---|---|---|---|---|---|---|---|---|---|---|---|
| | O | $X_1$ | $X_2$ | $X_3$ | $X_4$ | $X_5$ | $X_6$ | $X_7$ | $Y_1$ | $Y_2$ | $Y_3$ | $Y_4$ | $Y_5$ | $Y_6$ | $Y_7$ | | |
| C1 | 254 | 257 | 263 | 265 | 273 | 278 | 283 | 288 | 258 | 267 | 272 | 275 | 277 | 280 | 286 | 12.5 | 2.4 |
| C2 | 250 | 256 | 267 | 275 | 282 | 290 | 295 | 306 | 258 | 270 | 278 | 281 | 289 | 292 | 305 | 20 | 2.5 |
| C3 | 248 | 257 | 270 | 288 | 300 | 310 | 320 | 330 | 259 | 275 | 285 | 298 | 308 | 318 | 326 | 28 | 2.8 |
| C4 | 247 | 249 | 265 | 270 | 305 | 312 | 323 | 343 | 248 | 258 | 268 | 307 | 309 | 320 | 339 | 33 | 4.0 |
| C5 | 245 | 253 | 266 | 274 | 317 | 331 | 342 | 350 | 252 | 264 | 273 | 315 | 330 | 340 | 348 | 35 | 8.0 | constructions that may occur to one skilled in the art which fairly fall within the basic teaching herein set forth.

Also, the above specific embodiments and Examples does not limit the appended claims. In particular, it should be noted that all of the combinations of features as described in the embodiment and Examples are not always needed to solve the problem of the invention.

What is claimed is:
1. A nitride semiconductor epitaxial wafer, comprising:
a substrate; and
a nitride semiconductor layer formed on the substrate, the nitride semiconductor layer comprising a (002) plane in an upper surface thereof,
wherein an in-plane dispersion of a full width half maximum (FWHM) of an X-ray rocking curve in the (002) plane or a (100) plane of the nitride semiconductor layer is not more than 30%, wherein the in-plane dispersion of the FWHM of the nitride semiconductor layer is represented by a formula ((maximum value)−(minimum value))/(average value) based on values of the FWHM of the nitride semiconductor layer measured in a center of the nitride semiconductor epitaxial wafer, at least two first measurement points located from the center along a X direction, and at least two second measurement points located from the center along a Y direction, wherein the X direction and the Y direction are mutually arranged perpendicularly, and wherein the wafer is not less than 100 μm in thickness and not less than 50 mm in diameter.

2. The nitride semiconductor epitaxial wafer according to claim 1, wherein the dispersion is not more than 25%.

3. A nitride semiconductor device, comprising a high electron mobility transistor formed by using the nitride semiconductor epitaxial wafer according to claim 1.

4. The nitride semiconductor epitaxial wafer according to claim 1, wherein the FWHM in the (002) plane of the nitride semiconductor layer is not more than 300 seconds in the whole region in the (002) plane.

5. The nitride semiconductor epitaxial wafer according to claim 1, wherein the FWHM in the (100) plane of the nitride semiconductor layer is not more than 600 seconds in the whole region in the (100) plane.

\* \* \* \* \*